US008546230B2

(12) United States Patent
Adkisson et al.

(10) Patent No.: US 8,546,230 B2
(45) Date of Patent: Oct. 1, 2013

(54) BIPOLAR TRANSISTOR WITH A COLLECTOR HAVING A PROTECTED OUTER EDGE PORTION FOR REDUCED BASED-COLLECTOR JUNCTION CAPACITANCE AND A METHOD OF FORMING THE TRANSISTOR

(75) Inventors: James W. Adkisson, Jericho, VT (US); David L. Harame, Essex Junction, VT (US); Robert K. Leidy, Burlington, VT (US); Qizhi Liu, Lexington, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/296,496

(22) Filed: Nov. 15, 2011

(65) Prior Publication Data

US 2013/0119434 A1     May 16, 2013

(51) Int. Cl.
*H01L 21/331*     (2006.01)
*H01L 29/66*     (2006.01)

(52) U.S. Cl.
USPC .......................................... 438/349; 257/592

(58) Field of Classification Search
USPC .................. 438/312, 327, 347–349; 257/582, 257/592, E21.369–21.393, E29.114, E29.124
See application file for complete search history.

(56) References Cited

U.S. PATENT DOCUMENTS

| | | | |
|---|---|---|---|
| 5,106,767 A * | 4/1992 | Comfort et al. ............... | 438/359 |
| 5,402,002 A | 3/1995 | Meister et al. | |
| 5,668,396 A | 9/1997 | Sato | |
| 5,729,033 A | 3/1998 | Hafizi | |
| 6,620,732 B1 | 9/2003 | Schuegraf | |
| 6,864,560 B2 * | 3/2005 | Khater et al. ................. | 257/565 |
| 6,906,401 B2 | 6/2005 | Dunn et al. | |
| 6,967,144 B1 | 11/2005 | Sadovnikov | |
| 6,972,443 B2 * | 12/2005 | Khater .......................... | 257/197 |
| 7,235,861 B1 | 6/2007 | Howard et al. | |
| 7,625,792 B2 | 12/2009 | Geiss et al. | |
| 8,405,186 B2 * | 3/2013 | Camillo-Castillo et al. .. | 257/526 |
| 2008/0265282 A1 | 10/2008 | Gluschenkov et al. | |

OTHER PUBLICATIONS

Donkers et al., "A Novel Fully Self-Aligned SiGe: C HBT Architecture Featuring a Single-Step Epitaxial Collector-Base Process," IEDM, 2007, pp. 655-658.
Marc Cantell et al., U.S. Appl. No. 13/155,730, filed Jun. 8, 2011.

* cited by examiner

*Primary Examiner* — Clavin Lee
(74) *Attorney, Agent, or Firm* — Gibb & Riley, LLC; Michael J. LeStrange, Esq.

(57) ABSTRACT

Disclosed are embodiments of a transistor (e.g., bipolar junction transistor (BJT) or a heterojunction bipolar transistor (HBT)) and a method of forming the transistor with a collector region having a protected upper edge portion for reduced base-collector junction capacitance $C_{bc}$. In the embodiments, a collector region is positioned laterally adjacent to a trench isolation region within a substrate. Mask layer(s) cover the trench isolation region and further extend laterally onto the edge portion of the collector region. A first section of an intrinsic base layer is positioned above a center portion of the collector region and a second section of the intrinsic base layer is positioned above the mask layer(s). During processing these mask layer(s) prevent divot formation in the upper corner of the trench isolation region at the isolation region-collector region interface and further limit dopant diffusion from a subsequently formed raised extrinsic base layer into the collector region.

21 Claims, 4 Drawing Sheets

BIPOLAR TRANSISTOR WITH A COLLECTOR HAVING A PROTECTED OUTER EDGE PORTION FOR REDUCED BASED-COLLECTOR JUNCTION CAPACITANCE AND A METHOD OF FORMING THE TRANSISTOR

BACKGROUND

1. Field of the Invention

The embodiments disclosed herein relate to transistors and, more particularly, to a transistor structure (e.g., a bipolar junction transistor (BJT) structure or a heterojunction bipolar transistor (HBT) structure) with a collector region having a protected outer edge portion for reduced base-collector junction capacitance $C_{bc}$ and to a method of forming the transistor structure.

2. Description of the Related Art

For transistors used in radio frequency (RF) applications (e.g., bipolar junction transistors (BJTs) and, particularly, high performance heterojunction bipolar transistors (HBTs)), it is desirable to have a relatively high transit frequency $f_T$ and a relatively high maximum oscillation frequency $F_{max}$. $F_{max}$ is a function of $f_T$ and also of various parasitics, including parasitic resistances and parasitic capacitances. One such parasitic capacitance is base-collector junction capacitance $C_{bc}$. Reduction of this base-collector junction capacitance $C_{bc}$ can result in a higher $F_{max}$. Thus, it would be advantageous to provide a transistor structure, such as a bipolar junction transistor (BJT) structure or heterojunction bipolar transistor (HBT) structure, with reduced base-collector junction capacitance $C_{bc}$ as well as a method for forming such a transistor structure.

SUMMARY

In view of the foregoing, disclosed herein are embodiments of a transistor structure (e.g., bipolar junction transistor (BJT) structure or a heterojunction bipolar transistor (HBT) structure) and a method of forming the transistor structure with a collector region having a protected outer edge portion for reduced base-collector junction capacitance $C_{bc}$. Specifically, in the embodiments, a collector region is positioned laterally adjacent to a trench isolation region within a substrate. Mask layer(s) cover the trench isolation region and further extend laterally onto an outer edge portion of the collector region, but not the center portion. A first section of an intrinsic base layer (e.g., an epitaxial silicon layer in the case of a BJT or an epitaxial silicon germanium layer in the case of a HBT) is positioned above the center portion of the collector region and a second section of the intrinsic base layer is positioned above the mask layer(s). During processing these mask layer(s) prevent divot formation in the upper corner of the trench isolation region at the isolation region-collector region interface and further limit dopant diffusion from a subsequently formed raised extrinsic base layer into the collector region, particularly at the outer edge portion. As a result, base-collector junction capacitance $C_{bc}$ is reduced and, consequently, the maximum oscillation frequency $F_{max}$ of the transistor is increased.

More particularly, disclosed herein are embodiments of a transistor structure (e.g., a bipolar junction transistor (BJT) structure or a heterojunction bipolar transistor (HBT) structure). This transistor can comprise a semiconductor substrate, a trench isolation region within the substrate, and a collector region within the substrate and further positioned laterally adjacent to the trench isolation region. The collector region can have a center portion and an outer edge portion around the center portion such that the edge portion is positioned laterally between the center portion and the trench isolation region.

The transistor can further mask layer(s) and an intrinsic base layer. The mask layer(s) can be positioned above the trench isolation region and can further extend laterally onto the edge portion of the collector region. The intrinsic base layer can comprise an epitaxial semiconductor layer. In the case of a BJT, the intrinsic base layer can, for example, comprise an epitaxial silicon intrinsic base layer. Alternatively, in the case of an HBT, the intrinsic base layer can, for example, comprise an epitaxial silicon germanium intrinsic base layer. In any case, the intrinsic base layer can comprise a first section and a second section. The first section can be positioned above and immediately adjacent to the center portion of the collector region. The second section can be positioned above both the edge portion of the collector region and the trench isolation region, but can be separated therefrom by the mask layer(s).

The transistor can further comprise additional features above the intrinsic base layer. These additional features can include, but are not limited to, a raised extrinsic base layer, an emitter layer, dielectric spacer(s), additional dielectric layers, contacts, etc.

Also disclosed herein are embodiments of a method of forming a transistor structure (e.g., a bipolar junction transistor (BJT) structure or a heterojunction bipolar transistor (HBT) structure). The method embodiments can comprise providing a semiconductor substrate (e.g., a monocrystalline silicon substrate). A collector region and a trench isolation region can be formed within the substrate such that the collector region is positioned laterally adjacent to the trench isolation region. Specifically, the collector region and trench isolation region can be formed such that the collector region has a center portion and an outer edge portion and such that the outer edge portion is positioned around the center portion and further positioned laterally between the center portion and the trench isolation region.

Mask layer(s) can be formed on the top surface of the substrate above the trench isolation region and the collector region. Then, an opening can be formed in the mask layer(s) such that it extends vertically through the mask layer(s) and is aligned above a center portion of the collector region.

Once the opening is formed, an intrinsic base layer can be formed. For example, in the case of a BJT, a silicon intrinsic base layer can be formed and, in the case of an HBT, a silicon germanium intrinsic base layer can be formed. In any case, this intrinsic base layer can be formed (e.g., using a non-selective epitaxial deposition process) so that it comprises a first section above the center portion of the collector region and a second section above the mask layer(s). Thus, the intrinsic base layer is formed so that its second section is separated from the edge portion of the collector region and from the trench isolation region by the mask layer(s).

Additional process steps can then be performed to complete the transistor structure. These additional process steps can include, but are not limited to, the formation of the following features above the intrinsic base layer: an extrinsic base layer, an emitter layer, dielectric spacer(s), additional dielectric layers, contacts, etc.

BRIEF DESCRIPTION OF THE DRAWINGS

The embodiments herein will be better understood from the following detailed description with reference to the drawings, which are not necessarily drawing to scale and in which.

DETAILED DESCRIPTION

Typically, a bipolar junction transistor (BJT) structure or a heterojunction bipolar transistor (HBT) structure comprises a collector region (e.g., an N-type collector region), an intrinsic base layer (e.g., a P-type intrinsic base layer), a raised extrinsic base layer (e.g., a P-type raised extrinsic base layer), and an emitter layer (e.g., an N-type emitter layer). The collector region comprises a region of a semiconductor substrate defined by a shallow trench isolation (STI) region. The intrinsic base layer is positioned on the surface of the substrate above the collector region. The extrinsic base layer is positioned above the intrinsic base layer. Finally, the emitter layer extends vertically through the extrinsic base layer to the intrinsic base layer and is electrically isolated therefrom by a dielectric spacer.

For bipolar junction transistors (BJTs) and, particularly, high performance heterojunction bipolar transistors (HBTs) used in radio frequency (RF) applications, it is desirable to have a relatively high transit frequency $f_T$ and a relatively high maximum oscillation frequency $F_{max}$. $F_{max}$ is a function of $f_T$ and also of various parasitics, including parasitic resistances and parasitic capacitances. One such parasitic capacitance is base-collector junction capacitance $C_{bc}$. Unfortunately, the conventional techniques used to form such BJTs and HBTs often result in the formation of a divot in the STI region adjacent to the upper corner of the collector region (i.e., at the triple junction between the STI region, the collector region and the intrinsic base layer), which in turn can result in an increase in base-collector junction capacitance $C_{bc}$.

Figure 7A:
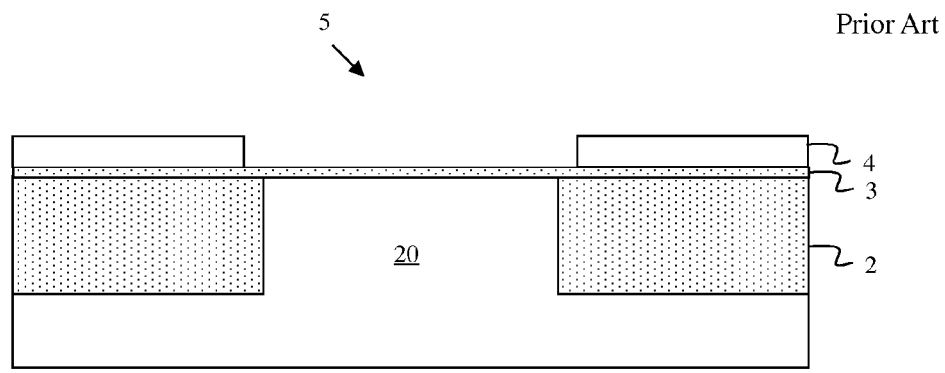
FIGS. 7A-7C are cross-section diagrams of a partially completed transistor form according to prior art techniques that result in increased base-collector junction capacitance $C_{bc}$.
Figure 7B:
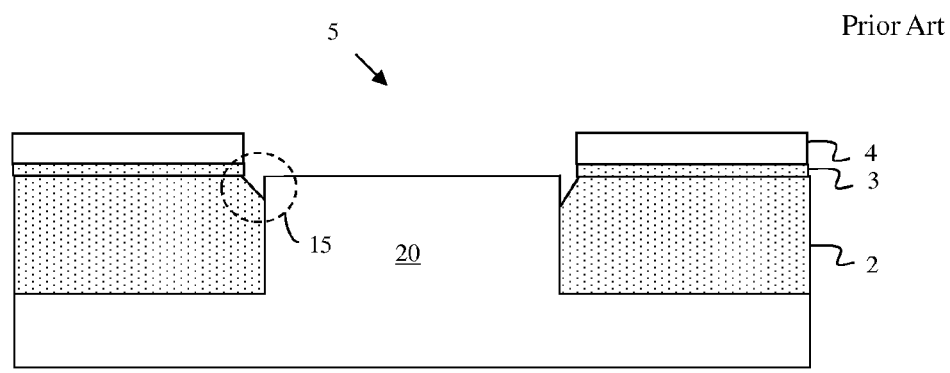
Figure 7C:
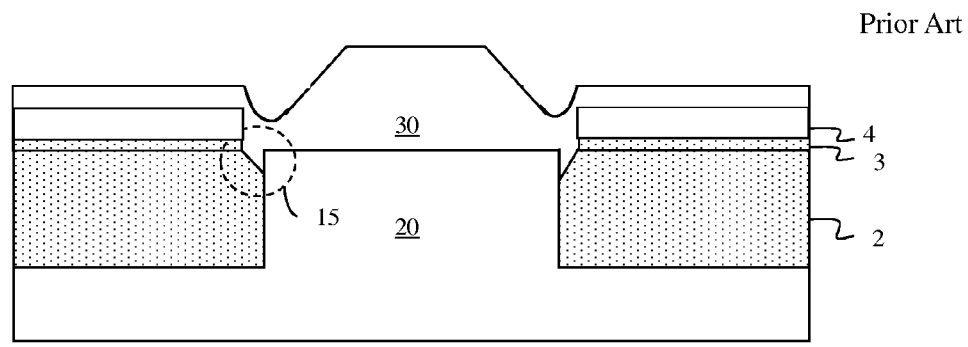

Specifically, as shown in FIG. 7A, during conventional BJT and HBT processing, an STI region 2 defines the dimensions of a collector region 20 within a semiconductor substrate. The STI region 2 is masked by a mask layer 4, which has an opening 5 above the collector region 20. Silicon dioxide (SiO$_2$) material 3, which is exposed on the surface of the semiconductor substrate within the mask opening 4, is etched back and the surface of the collector region 20 is pre-cleaned (see FIG. 7B) in preparation for a subsequent epitaxy process to form the intrinsic base layer 30 (see FIG. 7C). However, since the mask opening 5 is typically wider than the collector region 20 (i.e., since the sidewall of the mask opening 5 is above the STI region 2 and, specifically, set-back from the junction between the STI region 2 and collector region 20), the etch and pre-cleaning processes have a tendency to also pull back the isolation material in the upper corner of the STI region 2 adjacent to the upper corner of the collector region 20, leaving a divot 15 (i.e., a small pit or indentation). Consequently, when a subsequent non-selective epitaxy process is performed to form the intrinsic base layer 30 above the collector region 20 and the STI region 2, epitaxial semiconductor material will fill the divot 15 (see Figure &C). As a result base-collector junction capacitance $C_{bc}$ is increased. This increase in base-collector junction capacitance $C_{bc}$ is due to base dopant diffusion (e.g., P-type dopant diffusion, such as boron dopant diffusion) from the subsequently formed extrinsic base layer into the semiconductor material within the divot 15 and further into the upper corner of the collector region 20. It should be noted that diffusion of the base dopant into this area might be further exacerbated because the presence of other dopants (e.g., carbon and germanium), which tend to reduce base dopant diffusion, will be limited due to the resulting facetted semiconductor crystalline structure within the divot.

In view of the foregoing, disclosed herein are embodiments of a transistor structure (e.g., bipolar junction transistor (BJT) structure or a heterojunction bipolar transistor (HBT) structure) and a method of forming the transistor structure with a collector region having a protected outer edge portion for reduced base-collector junction capacitance $C_{bc}$. Specifically, in the embodiments disclosed herein, a collector region is positioned laterally adjacent to a trench isolation region within a substrate. Mask layer(s) cover the trench isolation region and further extend laterally onto the outer edge portion of the collector region, but not the center portion. A first section of an intrinsic base layer (e.g., an epitaxial silicon layer in the case of a BJT or an epitaxial silicon germanium layer in the case of a HBT) is positioned above the center portion of the collector region and a second section of the intrinsic base layer is positioned above the mask layer(s). During processing these mask layer(s) prevent divot formation in the upper corner of the trench isolation region at the isolation region-collector region interface and further limit dopant diffusion from a subsequently formed raised extrinsic base layer into the collector region, particularly at the outer edge portion. As a result, base-collector junction capacitance $C_{bc}$ is reduced and, consequently, the maximum oscillation frequency $F_{max}$ is increased.

Figure 1:
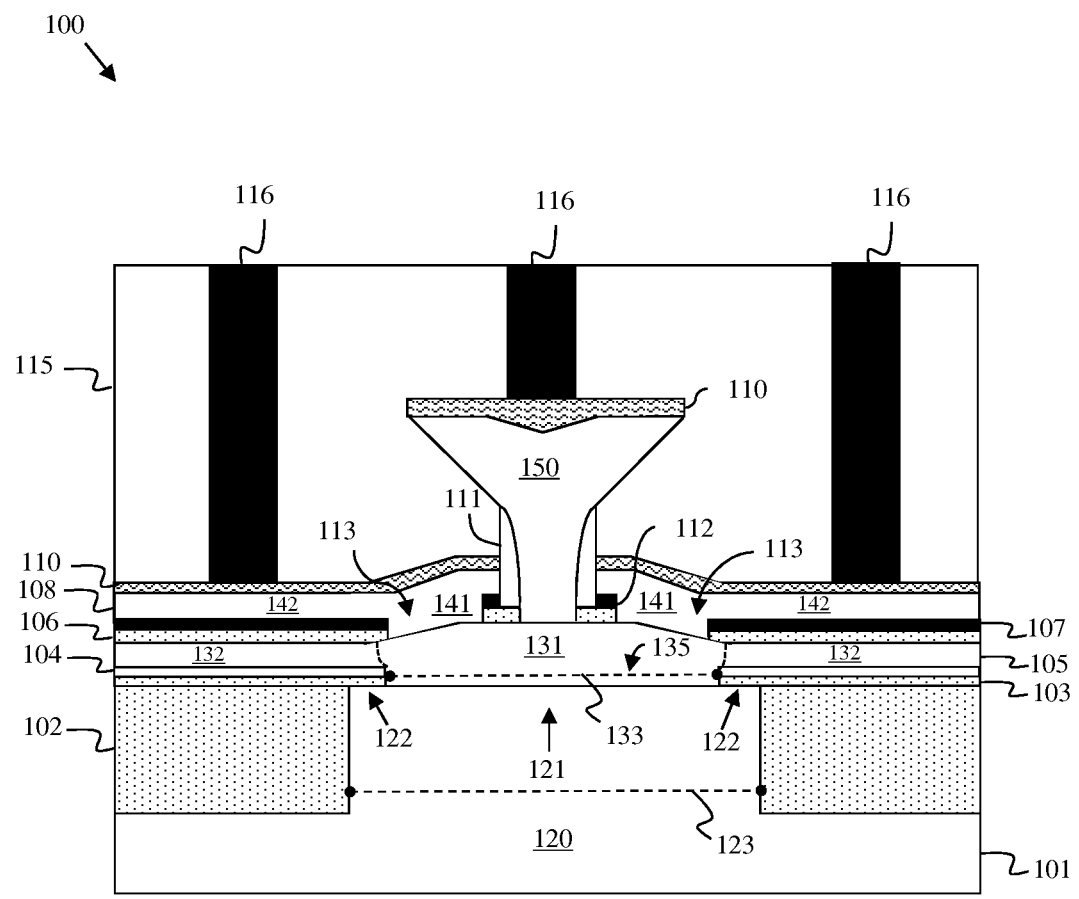
FIG. 1 is a cross-section diagram illustrating an embodiment of a transistor structure, such as a bipolar junction transistor (BJT) structure or a heterojunction bipolar transistor (HBT) structure, with reduced base-collector junction capacitance $C_{bc}$.

More particularly, referring to FIG. 1, disclosed herein are embodiments of a transistor structure 100. This transistor structure 100 can comprise, for example, a bipolar junction transistor (BJT) structure. Alternatively, this transistor structure 100 can comprise a heterojunction bipolar transistor (HBT) structure.

In any case, this transistor structure 100 can comprise a semiconductor substrate 101. This semiconductor substrate 101 can comprise a monocrystalline semiconductor material. For example, the semiconductor substrate 101 can comprise a bulk silicon substrate or any other suitable bulk semiconductor substrate, as illustrated in FIG. 1. Alternatively, the semiconductor substrate 101 can comprise a semiconductor layer of a semiconductor-on-insulator (SOI) wafer (e.g., a silicon layer of a silicon-on-insulator (SOI) wafer). The semiconductor substrate 101 can have a first type conductivity (e.g., a P-type conductivity). Thus, for example, the semiconductor substrate 101 can comprise a P-silicon substrate (i.e., a silicon substrate having a relatively low concentration of a P-type dopant).

The transistor structure 100 can further comprise a collector region 120 within the semiconductor substrate 101. This collector region 120 and, particularly, the center portion 121 of the collector region 120 can have a second type conductivity that is different from the first type conductivity of the substrate. Thus, for example, the collector region 120 can have an N-type conductivity. Various different configurations for BJT and HBT collector regions are well known in the art and could be incorporated into the transistor structure 100. For example, the collector region 120 can comprise a single N-well region. Alternatively, the collector region 120 can comprise multiple N-type collector components, having different doping concentrations and, thereby different conductivity levels. For example, the collector region 120 can comprise the following collector components described and illustrated in U.S. Patent Publication No. 2008/0265282 of Gluschenkov et al., published on Oct. 30, 2008, assigned to International Business Machines Corporation, and incorporated herein by reference: a N+ buried collector within the semiconductor substrate; a N− collector above the N+ buried collector and extending to the top surface of the semiconductor substrate; and an N+ selective implant collector (SIC) within the N− collector immediately adjacent to the N+ buried collector and separated from the top surface of the substrate by some distance.

The transistor structure 100 can further comprise a shallow trench isolation (STI) region 102 positioned within and at the top surface of the semiconductor substrate 101. Specifically, the collector region 120 can have a center portion 121 and an outer edge portion 122 around the center portion 121. The STI region 102 can be positioned laterally immediately adjacent to the outer edge portion 122 of the collector region 120 such that the outer edge portion 122 is positioned laterally between the center portion 121 and the trench isolation region 102. Thus, the STI region 102 can define the active area of the transistor 100 and, particularly, the dimensions (e.g., the length (not shown) and the width 123) of the collector region 120. This STI region 102 can, for example, comprise a relatively shallow trench patterned and etched into the top surface of the substrate 101 around (i.e., bordering) an area designated as the active area of the transistor 100. The trench can be filled with one or more isolation materials (e.g., silicon dioxide ($SiO_2$), silicon nitride (SiN), silicon oxynitride (SiON) or any other suitable isolation material or combination thereof).

The transistor structure 100 can further comprise at least one mask layer positioned above the STI region 102 and further extending laterally onto an edge portion 122 of the collector region 120. The mask layer(s) can comprise, for example, a first mask layer 103 and a second mask layer 104 stacked on top of the first mask layer 103. The first mask layer 103 can comprise a dielectric mask layer positioned immediately adjacent to the STI region 102 and the collector region 120. This dielectric mask layer 103 can have a thickness ranging between 1 and 50 nanometers (nm) (e.g., approximately 1.5 nm) and can comprise, for example, a silicon dioxide ($SiO_2$) layer, a silicon nitride (SiN) layer, a silicon oxynitride (SiNO), a high-K dielectric layer (e.g., hafnium oxide ($HFO_2$), zirconium oxide (ZrO2), etc.), or any other suitable dielectric layer capable of blocking dopant diffusion. The second mask layer 104 can be positioned above and immediately adjacent to the dielectric layer 103. This second mask layer 104 can, for example, comprise a polycrystalline semiconductor mask layer. For example, the polycrystalline semiconductor mask layer can comprise polycrystalline silicon or a polycrystalline silicon-based compound containing other Group IV elements, such as germanium or carbon. That is, the polycrystalline semiconductor mask layer can, alternatively, comprise a polycrystalline silicon germanium (SiGe) compound or polycrystalline silicon germanium carbide (SiGeC) compound, in which case the percentage of germanium could, for example, be in the range of 0-30% and, if applicable, the percentage of carbon could, for example, be in the range of 0-1%. The second mask layer 104 can further have, for example, a thickness of 10 to 80 nanometers (nm). Additionally, an opening 135 (i.e., a trench) can extend vertically through the mask layer(s) 103-104 to the collector region 120. This opening 135 can be aligned above the center portion 121 of the collector region 120 such that the stack of mask layers 103-104 remains on the edge portion 122 of the collector region 120. That is, this opening 135 can be approximately centered within the active region of the transistor structure 100, as defined by the STI region 102, and can have a width 133 that is less than the width 123 of the collector region 120. For example, the width 133 of the opening 135 through the mask layers 103-104 can be ¼ to 9/10 the width 123 of the collector region 120.

The transistor structure 100 can further comprise an intrinsic base layer 105. This intrinsic base layer 105 can comprise an epitaxial semiconductor layer. For example, in the case of a BJT, the intrinsic base layer 105 can comprise an epitaxial silicon intrinsic base layer. Alternatively, in the case of an HBT, the intrinsic base layer 105 can comprise an epitaxial silicon germanium intrinsic base layer. Additionally, the intrinsic base layer 105 can comprise a first section 131 (e.g., an inner section) and a second section 132 (e.g., an outer section) positioned laterally adjacent to the inner section 131. The first section 131 can be positioned above and immediately adjacent to the center portion 121 of the collector region 120 within the opening in the mask layers 103-104. The second section 132 can be positioned above the edge portion 122 of the collector region 120 and also above the STI region 102, but can be separated therefrom by the mask layer(s) 103-104. Those skilled in the art will recognize that as a result of the non-selective epitaxial deposition process used to form the intrinsic base layer 105, the first section 131 of the intrinsic base layer 105, which is formed immediately adjacent to the center portion 121 of the collector region 120 in the monocrystalline semiconductor substrate 101, will typically comprise a monocrystalline semiconductor material, whereas the second section 132 of the intrinsic base layer 105, which is formed immediately adjacent to the polycrystalline semiconductor mask layer 104, will typically comprise a polycrystalline semiconductor material and will usually be less thick than the first section 1. The intrinsic base layer 105 can be un-doped or, alternatively, can be doped with a relatively low concentration of a first type conductivity dopant (e.g., a P-type dopant) such that it has the first type conductivity (e.g., P-type conductivity) at a relatively low conductivity level. Optionally, the intrinsic base layer 105 can also be doped with carbon (C) or any other additional dopant suitable for preventing out-diffusion of the first type conductivity dopant.

As with conventional bipolar junction transistor (BJT) structures and conventional heterojunction bipolar transistor (HBT) structures, the transistor structure 100 disclosed herein can further comprise additional features including, but not limited to, additional mask layer(s), dielectric spacer(s), a raised extrinsic base layer, silicide layer(s), an emitter layer, additional dielectric layer(s), contacts, etc. Various different configurations for these features are well known in the art and can be incorporated into different embodiments of the transistor structure 100.

For example, as shown in FIG. 1, in an exemplary embodiment of the transistor structure 100 additional mask layer(s) can be positioned above and immediately adjacent to the intrinsic base layer 105. The additional mask layer(s) can comprise, for example, an additional dielectric mask layer 106. This additional dielectric mask layer 106 can comprise the same dielectric material or a different dielectric material than that used for the dielectric mask layer 103. Thus, this additional dielectric mask layer 106 can comprise, for example, a silicon dioxide ($SiO_2$) layer, a silicon nitride (SiN) layer, a silicon oxynitride (SiNO), a high-K dielectric layer (e.g., hafnium oxide ($HFO_2$), zirconium oxide (ZrO2), etc.), or any other suitable dielectric layer capable of blocking dopant diffusion. The additional mask layer(s) can further comprise an additional polycrystalline semiconductor mask layer 107 (e.g., an additional polycrystalline silicon mask layer, an additional polycrystalline silicon germanium mask layer, or an additional polycrystalline silicon germanium carbide mask layer). An opening 113 can extend vertically through the additional mask layer(s) 106, 107 to the intrinsic base layer 105. This opening 113 can be aligned above the interface between the first and second sections 131-132 of the intrinsic base layer 105 so as to leave an emitter opening landing pad portion 112 essentially centered above the first section 131 of the intrinsic base layer 105 and so as to further leave a remaining portion above the second section 131 of the intrinsic base layer 105.

A raised extrinsic base layer 108 can be positioned on the additional mask layer(s) and within the opening 113. Specifically, the raised extrinsic base layer 108 can comprise a first portion 141 within opening 113 such that it is above and immediately adjacent to the intrinsic base layer 105, thereby creating an extrinsic base to intrinsic base link-up region. The raised extrinsic base layer 108 can further comprise a second portion 142 that extends laterally over the remaining portion of the additional mask layer(s) 106-107 and, thereby above the second section 132 of the intrinsic base layer 105. The raised extrinsic base 108 can comprise an epitaxial semiconductor layer (e.g., an epitaxial silicon/polysilicon layer, see detailed discussion of crystalline structure below) and can have the first type conductivity (e.g., P-type conductivity). The concentration of dopant (e.g., P-type dopant) in the raised extrinsic base layer 108 can be relatively high as compared to the concentration of the same type conductivity dopant in the intrinsic base layer 105 and semiconductor substrate 101. Additionally, those skilled in the art will recognize that as a result of the non-selective epitaxial semiconductor deposition process used to form this raised extrinsic base layer 108, the crystalline structure of the resulting semiconductor layer will vary across in the different portions (e.g., 141, 142) depending upon the crystalline structure of the material below. That is, if the raised extrinsic base layer 108 is formed using a non-selective epitaxial deposition process, the first portion 141 of the extrinsic base layer 108 in the opening 113 above and immediately adjacent to the monocrystalline section 131 of the intrinsic base layer 105 will similarly be monocrystalline, whereas the second portion 142 above and immediately adjacent to the mask layer 107 will be polycrystalline. Finally, it should be noted that, while diffusion of dopant material (e.g., the P-type dopant) from the raised extrinsic base layer 108 into the intrinsic base layer 105 may occur, further diffusion into the collector region 120, particularly at the edge portion 122, will be limited due to the dielectric mask layer 103.

An emitter layer 150 (e.g., an essentially T-shaped emitter layer) can be positioned above the first section 131 of the intrinsic base layer 105. Specifically, the emitter layer 150 can have a lower portion that extends vertically through the raised extrinsic base layer 108 and the emitter opening landing pad 112 to the first section 131 of the intrinsic base layer 105. A dielectric spacer 111 can be positioned in the emitter opening and can surround the lower portion of the emitter layer 150 so as to electrically isolate it from the raised extrinsic base layer 108. The dielectric spacer 111 can comprise a dielectric material, such as silicon nitride (SiN), silicon oxynitride (SiON) or any other suitable dielectric material. The emitter layer 150 can further have an upper portion 152, which is above and wider than the lower portion 151 such that it extends laterally over at least the dielectric spacer 111. The emitter layer 150 can comprise, for example, a polycrystalline semiconductor layer (e.g., a polycrystalline silicon layer) having the same second type conductivity as the collector region (e.g., N-type conductivity).

A metal silicide layer 110 can be positioned on the top surface of the raised extrinsic base layer 108 and, particularly, over the second portion 142 of the raised extrinsic base layer 108. Optionally, this metal silicide layer 110 can further extend laterally over the first portion 141 of the raised extrinsic base layer 108. Additionally, a metal silicide layer 110 can also be positioned on the top surface of the upper portion of the emitter layer 150. Such metal silicide layers 110 can comprise a silicide of, for example, a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. It should be noted that, if applicable, the dielectric spacer 111 can also isolate the lower portion of the emitter layer 150 from any metal silicide layer 110 on the raised extrinsic base layer 108.

One or more additional dielectric layer(s) 115 can blanket (i.e., cover) the transistor structure 100, as described above. These additional dielectric layer(s) can comprise, for example, any suitable interlayer dielectric material(s). For example, the additional dielectric layer(s) 115 can comprise any of silicon dioxide ($SiO_2$), silicon nitride (SiN), borophosphosilicate glass (BPSG), etc. Finally, contacts 116 can extend vertically through the additional dielectric layer(s) 115 in order to contact the raised extrinsic base layer 108, the emitter layer 150, etc.

Figure 2:
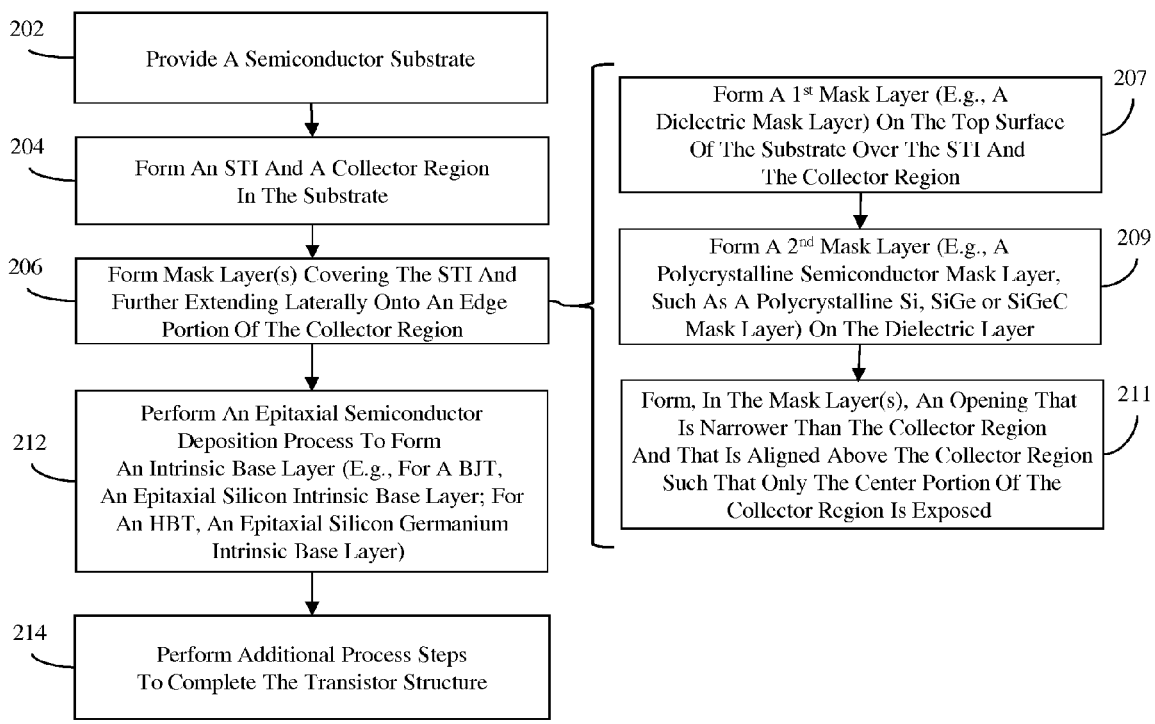
FIG. 2 is a flow diagram illustrating an embodiment of a method of forming a transistor structure such as the structure illustrated in FIG. 1.

Referring to FIG. 2, also disclosed herein are embodiments of a method of forming transistor structure 100 (e.g., bipolar junction transistor (BJT) structure or a heterojunction bipolar transistor (HBT) structure), as described in detail above and illustrated in FIG. 1.

Figure 3:
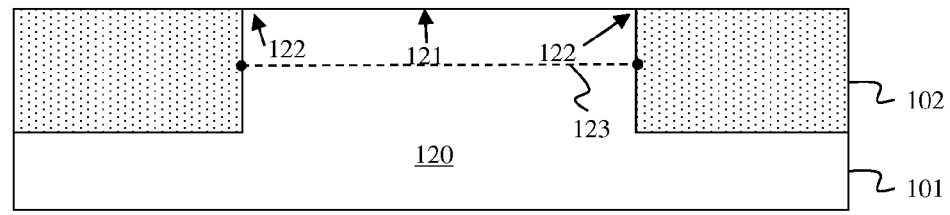
FIG. 3 is a cross-section diagram of a partially completed transistor structure formed according to the method embodiment of FIG. 2.

The method embodiments can comprise providing a semiconductor substrate 101 (202, see FIG. 3). This semiconductor substrate 101 can comprise a monocrystalline semiconductor material. For example, the semiconductor substrate 101 can comprise a bulk silicon substrate or any other suitable bulk semiconductor substrate, as illustrated in FIG. 3. Alternatively, the semiconductor substrate 101 can comprise a semiconductor layer of a semiconductor-on-insulator (SOI) wafer (e.g., a silicon layer of a silicon-on-insulator (SOI) wafer). In any case, the semiconductor substrate 101 can have a first type conductivity (e.g., P-type conductivity). Thus, for example, the semiconductor substrate 101 can comprise a P-silicon substrate (i.e., a silicon substrate having a relatively low concentration of a P-type dopant).

A shallow trench isolation (STI) region 102 can be formed within and at the top surface of the semiconductor substrate 101 so as to define the active area of the transistor structure 100 (204, see FIG. 3). The STI region 102 can be formed using conventional shallow trench isolation (STI) formation techniques. For example, a trench can be lithographically patterned and etched into the semiconductor substrate 101 so as to define the active region. The trench can then be filled with one or more isolation materials (e.g., silicon oxide (SiO$_2$), silicon nitride (SiN), silicon oxynitride (SiON) or any other suitable isolation materials).

Additionally, a collector region 120 can be formed within the active area of the semiconductor substrate 101, as defined by the STI region 102 (204, see FIG. 3). Thus, the STI region 102 defines the dimensions (e.g., the length (not shown) and the width 123) of the collector region 120 such that the collector region 120 has a center portion 121 and an outer edge portion 122 and such that the outer edge portion 122 is positioned around the center portion 121 and further positioned laterally between the center portion 121 and the trench isolation region 102. This collector region 120 can be formed (e.g., using one or more dopant implantation processes) so that the resulting collector region 120 and, particularly, the center portion 121 of the collector region 120 has a second type conductivity that is different from the first type conductivity (e.g., N-type conductivity) of the substrate. Various different techniques for forming BJT and HBT collector regions having different configurations are well known in the art and can be incorporated into the method embodiments disclosed herein. For example, the collector region 120 can be formed as a single N-well region within the substrate 101. Alternatively, the collector region 120 can be formed as multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; a N− collector above the N+ buried collector and extending to the top surface of the substrate; and an N+ selective implant collector (SIC) within the N− collector immediately adjacent to the N+ buried collector and separated from the top surface of the substrate by some distance.

Figure 4:
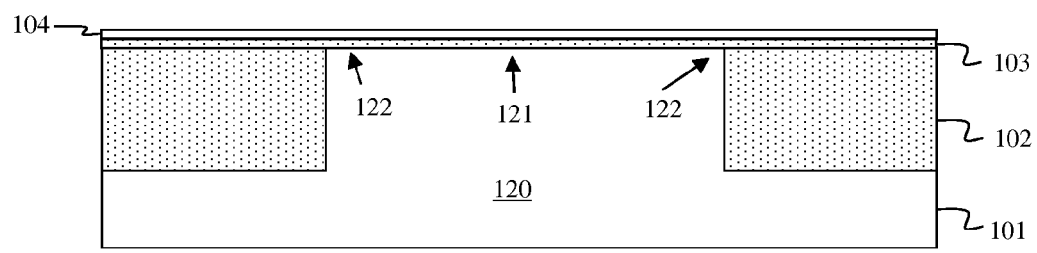
FIG. 4 is a cross-section diagram of a partially completed transistor structure formed according to the method embodiment of FIG. 2.
Figure 5:
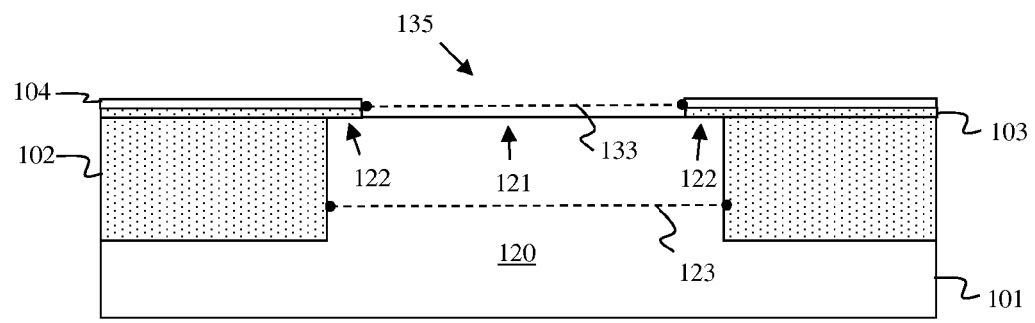
FIG. 5 is a cross-section diagram of a partially completed transistor structure formed according to the method embodiment of FIG. 2.

The method embodiments can further comprise forming at least one mask layer above the STI region 102 such that the mask layer(s) extend laterally onto an edge portion 122 of the collector region 120 and further such that the center portion 121 of the collector region 120 is exposed (206, see FIGS. 4-5). Specifically, a first mask layer 103 can be formed (e.g., deposited) on the top surface of the semiconductor substrate 101 over the STI region 102 and the collector region 120 (207, see FIG. 4). The first mask layer 103 can comprise, for example, a dielectric mask layer 103 (e.g., a silicon dioxide (SiO$_2$) layer, a silicon nitride (SiN) layer, a silicon oxynitride (SiNO), a high-K dielectric layer (e.g., hafnium oxide (HFO$_2$), zirconium oxide (ZrO2), etc.), or any other suitable dielectric layer capable of blocking dopant diffusion). This dielectric mask layer 103 can, for example, be formed such that it has a thickness ranging between 1 and 50 nanometers (nm) (e.g., approximately 1.5 nm). Next, a second mask layer 104 can be formed (e.g., deposited) on the first mask layer 103 (209, see FIG. 4). This second mask layer 104 can, for example, be formed such that it comprises a polycrystalline semiconductor mask layer. The polycrystalline semiconductor mask layer can, for example, comprise polycrystalline silicon or a polycrystalline silicon-based compound containing other Group IV elements, such as germanium or carbon. That is, the polycrystalline semiconductor mask layer can optionally comprise a polycrystalline silicon germanium (SiGe) compound or polycrystalline silicon germanium carbide (SiGeC) compound, in which case the percentage of germanium could, for example, be in the range of 0-30% and, if applicable, the percentage of carbon could, for example, be in the range of 0-1%. This polycrystalline semiconductor mask layer 104 can further be formed such that it has, for example, a thickness of 10-80 nanometers (nm). Then, an opening 135 (i.e., a trench) can be formed through the mask layer(s) through the mask layers 103-104 to the collector region 120 (211, see FIG. 5). Specifically, this opening 135 can be formed at process 211 using, for example, conventional lithographic patterning and etch techniques. However, this process 211 should specifically be performed so that the opening 135 is aligned above the center portion 121 of the collector region 120 and so that the mask layer(s) remain on the edge portion 122 of the collector region 120. That is, this process 211 should specifically be formed so that the opening 135 is approximately centered within the active region of the transistor structure 100, as defined by the STI region 102, and so that the opening 135 has smaller dimensions than the collector region 120 (e.g., specifically so that the width 133 of the opening 135 is less than the width 123 of the collector region 120). For example, the width 133 of the opening 135 through the mask layers 103-104 can be ¼ to 9/10 the width 123 of the collector region 120.

Figure 6:
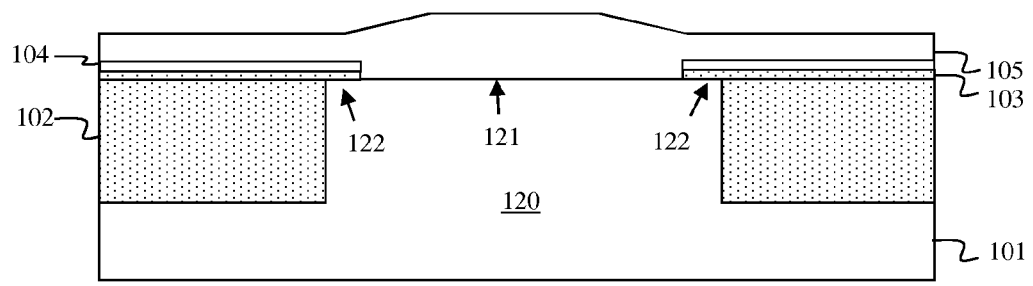
FIG. 6 is a cross-section diagram of a partially completed transistor structure formed according to the method embodiment of FIG. 2.

After the opening 135 is formed in the mask layer(s) at process 209, a non-selective epitaxial semiconductor deposition process can be performed in order to an intrinsic base layer 105 (212, see FIG. 6). Specifically, a conventional pre-cleaning process can be performed in order to clean the exposed surface of the semiconductor substrate 101 within the opening 135 in preparation for epitaxial deposition. Then, an epitaxial semiconductor layer (e.g., an epitaxial silicon layer in the case of a BJT structure or an epitaxial silicon germanium layer in the case of an HBT structure) having a predetermined thickness can be formed within the opening and further extending laterally over the mask layer(s) using a conventional epitaxial deposition process (e.g., a non-selective, ultra high-vacuum/chemical vapor deposition (UHV/CVD), low-temperature epitaxy (LTE) process). This process 212 can specifically be performed so that the resulting intrinsic base layer 105 comprises a first section 131 (e.g., an inner section) and a second section 132 (e.g., an outer section) positioned laterally adjacent to the inner section 131. The first section 131 can fill the opening 135 in the mask layers 103-104 such that it is positioned above and immediately adjacent to the center portion 121 of the collector region 120. The second section 132 can be positioned above the edge portion 122 of the collector region 120 and also above the STI region 102, but can be separated therefrom by the mask layer(s) 103-104.

Those skilled in the art will recognize that as a result of the non-selective epitaxial deposition process 210 used to form the intrinsic base layer 105, the first section 131 of the intrinsic base layer 105, which is formed immediately adjacent to the center portion 121 of the collector region 120 in the monocrystalline semiconductor substrate 101, will typically comprise a monocrystalline semiconductor material. However, the second section 122 of the intrinsic base layer 105, which is formed immediately adjacent to the polycrystalline semiconductor mask layer 104, will typically comprise a polycrystalline semiconductor material and be usually less thick than the first section 121. This intrinsic base layer 105 can be un-doped. Alternatively, the intrinsic base layer 105 can be in-situ doped during the epitaxial deposition process 212 or subsequently implanted with a relatively low concentration of a first type conductivity dopant (e.g., a P-type dopant) such that it has the first type conductivity (e.g., P-type conductivity) at a relatively low conductivity level. Optionally, the intrinsic base layer 105 can also be in-situ doped during the epitaxial deposition process 212 or subsequently implanted with carbon (C) or any other additional dopant suitable for preventing outdiffusion of the first type conductivity dopant.

After the intrinsic base layer 105 is formed at process 212, additional process steps can be performed in order to complete the transistor structure 100 (214, see FIG. 1). These additional process steps can comprise conventional BJT and HBT process steps for forming additional features including, but not limited to, the following features described in detail above: additional mask layer(s), dielectric spacer(s), a raised extrinsic base layer, silicide layer(s), an emitter layer, contacts, etc. Various different techniques for forming these features are well known in the art and, thus, are omitted from this specification in order to allow the reader to focus on the salient aspects of the method embodiments. However, it should be understood that any of these various techniques could be incorporated into the different method embodiments disclosed.

It should be noted that in the embodiments, described above, the mask layer(s) 103, 104 serve several functions. For example, since the mask layers 103-104 extend laterally from the STI region 102 onto the outer edge portion 122 of the collector region 120, the isolation material in the STI region 102 is protected and remains intact during both the etch process used to form the opening 135 in the mask layer(s) 103,104 at process 211 and during the epitaxy pre-clean process used prior to the formation of an epitaxial intrinsic base layer 105 at process 212. In other words, no divot is formed in the upper corner of the STI region 102 at the STI region 102-collector region 120 interface. As a result, during formation of the intrinsic base layer 105 at process 212, semiconductor material is not formed next to the sidewall of the collector region 120, thereby reducing base-collector junction capacitance $C_{bc}$. Furthermore, although the epitaxial extrinsic base layer 108 is either in situ doped or subsequently implanted with a first type conductivity dopant (e.g., a P-type dopant) so that it has the first type conductivity (e.g., P-type), diffusion of this dopant (e.g., the P-type dopant) through the intrinsic base layer 105 into the collector region 120, particularly at the outer edge portion 122, will be limited due to the dielectric mask layer 103. Limiting dopant diffusion in this manner also reduces base-collector junction capacitance $C_{bc}$.

It should be noted that in the structure and method embodiments described above, the first type conductivity is referred to as being P-type (i.e., a positive-type) conductivity and the second type conductivity is referred to as being N-type (i.e., negative type) conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels of the different transistor components will depend upon the relative concentration levels of the dopants. For example, a higher P-type conductivity level in the raised extrinsic base layer 108 as compared to the intrinsic base layer 105 can be achieved using a higher relative dopant concentration.

It should be understood that the terminology used herein is for the purpose of describing particular embodiments only and is not intended to be limiting of the embodiments. As used herein, the singular forms "a", "an" and "the" are intended to include the plural forms as well, unless the context clearly indicates otherwise. It should further be understood that the terms "comprises", "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof. In addition, it should be understood that terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", "immediately adjacent to", etc., mean that at least one element physically contacts another element (without other elements separating the described elements).

It should further be understood that the method embodiments, as described above, shall be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Finally, it should be understood that the corresponding structures, materials, acts, and equivalents of all means or step plus function elements in the claims below are intended to include any structure, material, or act for performing the function in combination with other claimed elements as specifically claimed. The description of the embodiments contained in the specification have been presented for purposes of illustration and description, but is not intended to be exhaustive or limited to the embodiments in the forms disclosed. Many modifications and variations to the disclosed embodiments will be apparent to those of ordinary skill in the art without departing from the scope and spirit of the embodiments.

Therefore, disclosed above are embodiments of a transistor structure (e.g., bipolar junction transistor (BJT) structure or a heterojunction bipolar transistor (HBT) structure) and a method of forming the transistor structure with a collector region having a protected outer edge portion for reduced base-collector junction capacitance $C_{bc}$. Specifically, in the embodiments disclosed herein, a collector region is positioned laterally adjacent to a trench isolation region within a substrate. Mask layer(s) cover the trench isolation region and further extend laterally onto the outer edge portion of the collector region, but not the center portion. A first section of an intrinsic base layer (e.g., an epitaxial silicon layer in the case of a BJT or an epitaxial silicon germanium layer in the case of a HBT) is positioned above the center portion of the collector region and a second section of the intrinsic base layer is positioned above the mask layer(s). During processing these mask layer(s) prevent divot formation in the upper corner of the trench isolation region at the isolation region-collector region interface and further limit dopant diffusion from a subsequently formed raised extrinsic base layer into the collector region, particularly at the outer edge portion. As a result, base-collector junction capacitance $C_{bc}$ is reduced and, consequently, the maximum oscillation frequency $F_{max}$ is increased.

What is claimed is:

1. A method of forming a transistor, said method comprising:
   forming, in a semiconductor substrate, a trench isolation region positioned laterally adjacent to a collector region;
   forming at least one mask layer on a top surface of said substrate above said trench isolation region and said collector region;
   forming an opening in said at least one mask layer above a center portion of said collector region; and
   forming an intrinsic base layer such that said intrinsic base layer comprises:
      a first section above said center portion of said collector region; and
      a second section above said at least one mask layer such that said at least one mask layer separates said second section from an edge portion of said collector region and said trench;
   wherein said semiconductor substrate comprising monocrystalline silicon substrate and said forming of said intrinsic base layer comprising performing a non-selective epitaxial semiconductor deposition process such that said first section comprises monocrystalline semiconductor material and said second section comprises a polycrystalline semiconductor material.

2. The method of claim 1, said forming of said at least one mask layer comprising:
   forming a first mask layer; and
   forming a second mask layer on said first mask layer.

3. The method of claim 2, said forming of said first mask layer comprising forming a dielectric mask layer and said forming of said second mask layer comprising forming a polycrystalline semiconductor mask layer.

4. The method of claim 3, said forming of said polycrystalline semiconductor mask layer comprising epitaxially depositing a 10-80 nanometer thick layer of any of polycrystalline silicon, polycrystalline silicon germanium and polycrystalline silicon germanium carbide.

5. The method of claim 3, said at least one mask layer above said edge portion preventing divot formation in an upper corner of said trench isolation region during said forming of said opening, and said dielectric mask layer further limiting dopant diffusion from a subsequently formed extrinsic base layer into said collector region at said edge portion.

6. The method of claim 1,
   said collector region having a first width, and
   said opening having a second width that less than said first width.

7. A method of forming a heterojunction bipolar transistor, said method comprising:
   forming, in a silicon substrate, a trench isolation region positioned laterally adjacent to a collector region;
   forming at least one mask layer on a top surface of said substrate above said trench isolation region and said collector region;
   forming an opening in said at least one mask layer above a center portion of said collector region; and
   forming a silicon germanium intrinsic base layer such that said intrinsic base layer comprises:
      a first section above said center portion of said collector region; and
      a second section above said mask layer such that said at one mask layer separates said second section from an edge portion of said collector region and said trench isolation region;
   wherein said forming of said silicon germanium intrinsic base layer comprises performing a non-selective epitaxial silicon germanium deposition process, such that said first section comprises a monocrystalline silicon germanium material and said second section comprises a polycrystalline silicon germanium material.

8. The method of claim 7, said forming of said at least one mask layer comprising:
   forming a first mask layer comprising a dielectric mask layer; and
   forming a second mask layer on said first mask layer, said second mask layer comprising a polycrystalline semiconductor mask layer comprising any of polycrystalline silicon, polycrystalline silicon germanium and polycrystalline silicon germanium carbide and being 10-80 nanometers (nm) thick.

9. The method of claim 7,
   said collector region having a first width,
   said opening having a second width that is less than said first width, and
   said at least one mask layer above said edge portion preventing divot formation in an upper corner of said trench isolation region during said forming of said opening and further limiting dopant diffusion from a subsequently formed extrinsic base layer into said collector region at said edge portion. germanium material.

10. A transistor comprising:
    a trench isolation region in a semiconductor substrate;
    a collector region in said substrate positioned laterally adjacent to said trench isolation region;
    at least one mask layer above said trench isolation region and further extending laterally onto an edge portion of said collector region; and
    an intrinsic base layer comprising:
       a first section above a center portion of said collector region; and
       a second section above said edge portion of said collector region and said trench isolation region, said at least one mask layer separating said second section from said edge portion of said collector region and said trench isolation region;
    wherein said intrinsic base layer comprises a non-selective epitaxial semiconductor layer, such that said first section comprises a monocrystalline semiconductor material and said second section comprises a polycrystalline semiconductor material.

11. The transistor of claim 10, said at least one mask layer comprising a first mask layer and a second mask layer above said first masked layer.

12. The transistor of claim 11, said first mask layer comprising a dielectric mask layer and said second mask layer comprising a polycrystalline semiconductor mask layer.

13. The transistor of claim 12, said polycrystalline semiconductor mask layer comprising any of polycrystalline silicon, polycrystalline silicon germanium and polycrystalline silicon germanium carbide and further being 10-80 nanometers (nm) thick.

14. The transistor of claim 12, further comprising an extrinsic base layer above said intrinsic base layer, said extrinsic base layer being doped with a dopant and said dielectric mask layer limiting diffusion of said dopant into said collector region at said edge portion.

15. The transistor of claim 10,
said at least one mask layer having an opening above said center portion of said collector region,
said collector region having a first width, and
said opening having a second width that is less than said first width.

16. A heterojunction bipolar transistor comprising:
a trench isolation region in a silicon substrate;
a collector region in said substrate positioned laterally adjacent to said trench isolation region;
at least one mask layer above said trench isolation region and further extending laterally onto an edge portion of said collector region; and
a silicon germanium intrinsic base layer comprising:
  a first section above a center portion of said collector region; and
  a second section above said edge portion of said collector region and said trench isolation region, said at least one mask layer separating said second section from said edge portion of said collector region and said trench isolation region;
wherein said silicon germanium intrinsic base layer comprises a non-selective epitaxial silicon germanium layer, such that said first section comprises a monocrystalline silicon germanium material and said second section comprises a polycrystalline silicon germanium material.

17. The transistor of claim 16, said at least one mask layer comprising a first mask layer and a second mask layer above the first mask layer.

18. The transistor of claim 17, said first mask layer comprising a dielectric mask layer and said second mask layer comprising a polycrystalline semiconductor mask layer.

19. The transistor of claim 18, said polycrystalline semiconductor mask layer comprising any of polycrystalline silicon, polycrystalline silicon germanium and polycrystalline silicon germanium carbide and further being 10-80 nanometers (nm) thick.

20. The transistor of claim 18, further comprising an extrinsic base layer above said intrinsic base layer, said extrinsic base layer being doped with a dopant and said dielectric mask layer limiting diffusion of said dopant into said collector region at said edge portion.

21. The transistor of claim 16,
said at least one mask layer having an opening above said center portion of said collector region,
said collector region having a first width, and
said opening having a second width that less than said first width.

* * * * *